US008495803B2

(12) United States Patent
Fiedler

(10) Patent No.: US 8,495,803 B2
(45) Date of Patent: Jul. 30, 2013

(54) MECHANICAL-MAGNETIC CONNECTING STRUCTURE

(75) Inventor: Joachim Fiedler, Hannover (DE)

(73) Assignee: Fidlock GmbH, Hannover (DE)

( * ) Notice: Subject to any disclaimer, the term of this patent is extended or adjusted under 35 U.S.C. 154(b) by 279 days.

(21) Appl. No.: 12/936,772

(22) PCT Filed: Apr. 15, 2009

(86) PCT No.: PCT/DE2009/000483
§ 371 (c)(1),
(2), (4) Date: Oct. 7, 2010

(87) PCT Pub. No.: WO2009/127196
PCT Pub. Date: Oct. 22, 2009

(65) Prior Publication Data

US 2011/0030174 A1 Feb. 10, 2011

(30) Foreign Application Priority Data

Apr. 15, 2008 (DE) ........................ 10 2008 019 063

(51) Int. Cl.
*B65B 45/16* (2006.01)
*E05C 1/00* (2006.01)
*H05K 5/02* (2006.01)

(52) U.S. Cl.
USPC ............. 24/303; 220/230; 220/315; 220/326; 292/251.5; 70/158; 70/160; 361/679.58

(58) Field of Classification Search
None
See application file for complete search history.

(56) References Cited

U.S. PATENT DOCUMENTS

| | | | | |
|---|---|---|---|---|
| 5,317,789 | A * | 6/1994 | Levy | 24/303 |
| 5,349,725 | A * | 9/1994 | Levy | 24/303 |
| 5,367,891 | A * | 11/1994 | Furuyama | 63/29.2 |
| 5,920,966 | A | 7/1999 | Chen | |
| 6,640,398 | B2 * | 11/2003 | Hoffman | 24/303 |
| 7,065,841 | B2 * | 6/2006 | Sjoquist | 24/303 |
| 7,178,207 | B2 * | 2/2007 | Wong et al. | 24/303 |
| 7,181,939 | B2 * | 2/2007 | Andersen | 70/395 |
| 7,523,527 | B2 * | 4/2009 | Garber | 24/303 |
| 7,770,413 | B2 * | 8/2010 | Tyler | 63/12 |
| 2002/0116794 | A1 * | 8/2002 | Hoffman | 24/303 |
| 2005/0177985 | A1 * | 8/2005 | Sjoquist | 24/104 |
| 2007/0028429 | A1 | 2/2007 | Ishida | |
| 2008/0047111 | A1 * | 2/2008 | Garber | 24/303 |
| 2008/0141502 | A1 * | 6/2008 | Khubani | 24/303 |
| 2010/0263173 | A1 * | 10/2010 | Clarke et al. | 24/303 |
| 2010/0287741 | A1 * | 11/2010 | Fiedler | 24/303 |

FOREIGN PATENT DOCUMENTS

| | | | |
|---|---|---|---|
| WO | 9218028 | A1 | 10/1992 |
| WO | 2008006357 | A2 | 1/2008 |

* cited by examiner

*Primary Examiner* — Jack W. Lavinder
(74) *Attorney, Agent, or Firm* — The Webb Law Firm

(57) ABSTRACT

A mechanical-magnetic connecting structure for releasably connecting a first element with a second element is provided. The connecting structure consists of a module A which is firmly connected with the first element or is rotatably arranged in the first element, and a module B which is firmly connected with the second element or is rotatably arranged in the second element. The module A is rotatably guided in module B. In module A at least one magnet and in module B at least one armature or second magnet is arranged and the shape, location and polarity of the magnets or of the magnet and the armature are designed such that when rotating module A relative to module B, the magnets or magnet and armature move from a closed position with maximum magnetic attraction into an open position with weakened magnetic attraction or a magnetic repulsion of module A and module B is obtained.

7 Claims, 26 Drawing Sheets

A-A

A-A

MECHANICAL-MAGNETIC CONNECTING STRUCTURE

CROSS-REFERENCE TO RELATED APPLICATION

This application is a National Phase Patent Application of International Patent Application Number PCT/EP2009/000483, filed on Apr. 15, 2009, which claims priority of German Patent Application Number 10 2008 019 063.2, filed on Apr. 15, 2008.

BACKGROUND OF THE INVENTION

Field of the Invention

This invention relates to a mechanical-magnetic connecting structure, i.e. a mechanical lock, which closes supported by magnetic force and in particular is utilized as closure on bags, rucksacks and comparable objects, wherein this enumeration should not limit the field of use of the invention. Such connecting structure is described in the document WO 2008/006357. This magnetic closure consists of a two-part magnetic system, so that the two closure halves attract and mechanically lock each other from a predetermined minimum distance. With this mechanical lock the magnetic force urges a locking piece against a resilient and hence yielding locking element. The locking piece and the resilient locking element overlap or undercut each other in the condition snapped into place. For opening the closure, the locking piece is shifted with respect to the locking element until a non-engagement position is reached, in which the two elements no longer are in engagement, i.e. the mechanical lock is released. With this shifting, the magnetic system simultaneously is moved into a position in which the magnetic force of attraction either is weakened considerably or a repulsive force is applied, which opens the closure. The magnetic system only insignificantly contributes to the stability and strength of the closure, but only serves to allow a haptically good closing and opening of the closure.

The loadability of the closure is determined by the mechanical lock and substantially depends on how large the overlap surface or the undercut surface of the lock is. The larger the overlap surface or the undercut surface, the greater the mechanical stability of the lock, when all components of the closure are constructed adequately. The possibilities for forming the overlap surface or the undercut surface as large as possible are limited for several reasons, which will be explained below:

It is a specific property of a pawl closure snapping into place according to the prior art described in WO 2008/006357 that the same only has the required stability and loadability when the resilient element is dimensioned sufficiently strong, which inevitably also involves a greater spring force. To ensure that the snap-in process can be effected on its own, i.e. exclusively by means of magnetic force, a magnet adapted to the spring force is required. In other words, the resilient element must have a sufficient mechanical stability, in order to ensure the desired locking function. However, this requires a sufficiently strong magnet. Thus, two mutually exclusive requirements are placed on the magnet: The magnet must be strong enough to overcome the spring force, and the magnet should be as small and light as possible, in order to reduce the costs and the weight.

In the closures known from the prior art WO 2008/006357 there is also a second problem, which in a rotary closure results from the following facts: The most common magnetic system has two magnetic poles per magnetic element and for opening is rotated from an attracting position by about 120° into an at least partly repelling position. In this position, the magnetic force of repulsion supports the opening of the closure. However, to enable the closure to open on its own, the mechanical lock must be out of engagement.

In other words: There is only one predetermined angular range available for locking. This angular range cannot be increased, as from the maximum available 360 degrees a predetermined angular range is required, in which the locking elements must be out of engagement. The available angular range of the closed condition, however, even is substantially smaller, since opening should only be effected when the magnets have reached a position in which they at least partly repel each other, in order to obtain the desired pleasant opening haptics of the closure. Since the overlap or undercut should only occur in the angular range of the closed condition, an objective limit thus exists for an increase of the overlap or undercut surface by means of an increase of the angular range.

If the overlap or undercut surface is to be increased, it is possible to increase the diameter of the rotary closure. A closure with a greater diameter can be undesirable e.g. on a handbag.

Another way of increasing the overlap or undercut surface consists in increasing the depth of the overlap or undercut in radial direction. However, this measure likewise reaches a limit, which results from this constructive measure itself and from the special properties of the magnetic force, which will be explained below:

When pulling the closure halves together, the parts snapping into each other get in contact in that the locking piece moves a predetermined distance against the resilient and hence yielding locking element, until snapping into place occurs. This distance is the greater the further the locking element must be pushed away in radial direction, i.e. or proportionally increasing compressive force is required to overcome the likewise proportionally increasing spring force of the locking element. It is known, however, that magnetic forces have a non-linear profile and greatly increase only at close range. Since the magnetic force should, however, pull the closure together automatically and thus must overcome the spring force, it is required to select a particularly strong magnet to overcome a long spring deflection, which magnet overcomes the initial spring force already at a greater distance. However, this leads to the demand for a greater, heavier and more expensive magnet. In addition, the magnetic force at close range, i.e. in the condition snapped into place, is higher than required. This in turn requires a greater effort on opening, which is undesirable, however, e.g. for handbags, since these closures should have a soft and pleasant haptics.

SUMMARY OF THE INVENTION

It is the object of the invention to improve a generic mechanical-magnetic connecting structure for releasably connecting a first element with a second element such that its locking force is increased without increasing the mechanical latching elements and the magnets.

According to an exemplary embodiment of the invention a mechanical-magnetic connecting structure includes a module A which is firmly connected with the first element or is rotatably arranged in the first element, and a module B which is firmly connected with the second element or is rotatably arranged in the second element. Module A is rotatably guided in module B. In module A at least one magnet is arranged and in module B at least one armature or second magnet is arranged. The shape, the position and the polarity of the magnets or of the magnet and the armature are designed or chosen such that when rotating module A 51 relative to module B 52, the magnets or the magnet and the armature can move from a closed position with maximum magnetic attraction into an open position with weakened magnetic attraction. Or instead of the weakened magnetic attraction a magnetic repulsion is obtained between module A and module B. Furthermore, a positive lock is provided, which exists between two engagement portions at module A and module B, i.e. when the modules are attracted to each other by the magnetic force, the two engagement portions become operatively connected and lock each other.

In accordance with an exemplary embodiment of the invention, the engagement portion which is arranged on a spring locking element on module B is of the helical type and the matching engagement portion on module A likewise is of the helical type. Module A and module B close without rotation such that the helical engagement portion positively snaps into place with the helical engagement portion by means of the magnetic attraction. Module A and module B can be opened such that when rotating the modules and correspondingly rotating the magnets from the closed position into the open position, the helical engagement portions are screwed out of engagement.

The use of helical engagement portions provides for a considerable increase of the undercut or overlap surface of the engaging elements. Hence, all the above-described disadvantages of the prior art are eliminated, which will be explained in detail with reference to the embodiments.

According to an exemplary embodiment of the invention the helical engagement portion has a plurality of threads. Hence, an even greater undercut or overlap surface is produced, which leads to an even higher mechanical loadability of the closure. On the other hand, it is possible to construct distinctly smaller closures with a predetermined loadability.

According to a further exemplary embodiment, the helical resilient engagement portion consists of separate segments. Since each of the resilient elements as such now is smaller than comparable constructions from the prior art, they can also be designed constructionally different from large spring elements. In particular it is possible to use elastic materials. In addition, the use of a plurality of independent segments offers a high reliability, even if one segment should fail.

According to a further exemplary embodiment, the helical engagement portion consists of spaced, resilient pins which are arranged one beside the other on a helical line.

BRIEF DESCRIPTION OF THE DRAWINGS

The invention will be explained below with reference to a comparative example from the prior art and with reference to embodiments of the invention in conjunction with attached drawings.

DETAILED DESCRIPTION OF THE INVENTION

Figure 1A:
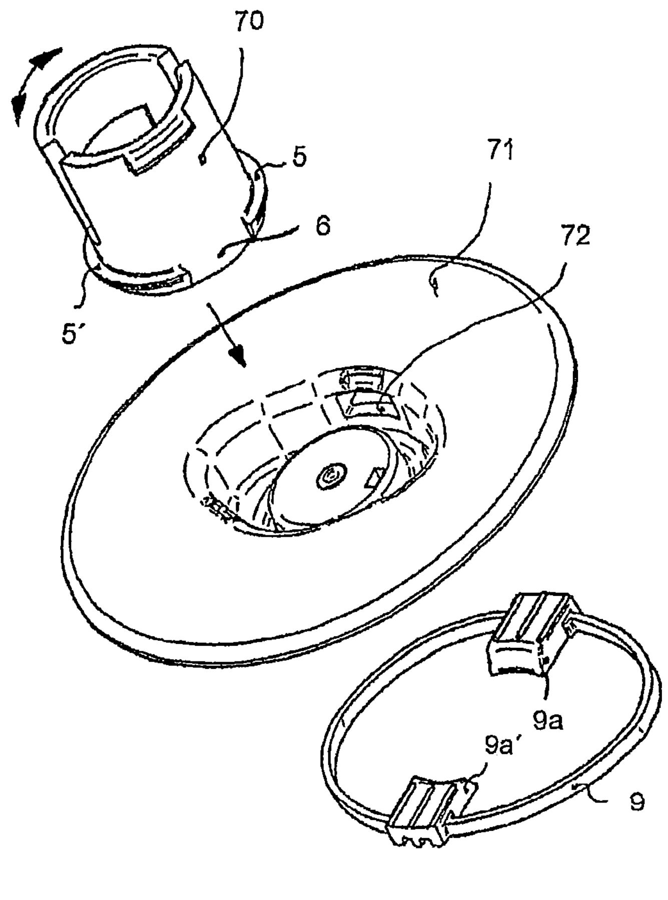
Fig. 1a (PRIOR ART)
FIG. 1*a* shows a comparative example from the prior art, by means of which the invention will be explained.
Figure 1B:
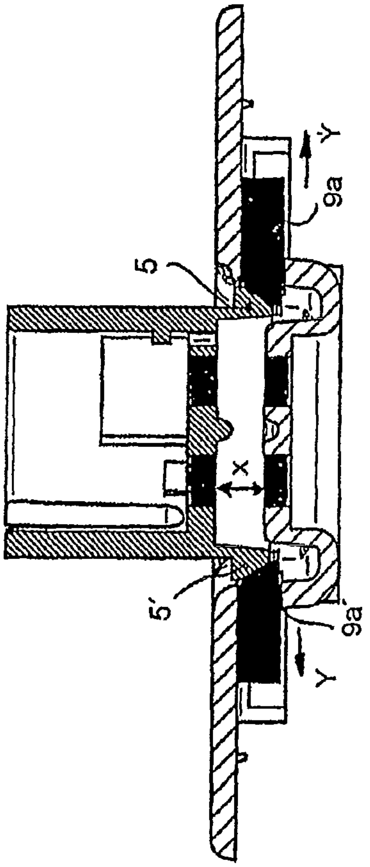
Fig. 1b (PRIOR ART)
FIG. 1*b* shows the closure according to FIG. 1*a;*

FIG. 1 shows the essential functional elements of a magnetic closure from the prior art according to the document WO 2008/006357, which herewith is incorporated in the present application. An actuating member 70 equipped with magnets is introduced into the lower part 71 in direction of arrow. In the lower part 71, a spring locking element 9 with spring locking pieces 9*a*, 9*a*' is arranged. In the mounted condition, the spring locking pieces 9*a*, 9*a*' protrude through the apertures 72. The actuating member 70 includes locking pieces 5 and 5' as well as release gaps 6 and 6', with 6' not being visible in this Figure. When the actuating member 70 is introduced into the lower part 71 in direction of arrow, the actuating member 70 rotates into the illustrated position by magnetic force, in which position the magnets shown in FIG. 1*b* attract each other. The two locking pieces 5 and 5' press onto the spring locking pieces 9*a*, 9*a*', until the closure snaps into place. For opening, the actuating member 70 is rotated to the left or to the right in direction of arrow, until the spring locking pieces 9*a*, 9*a*' are positioned in the release gaps 6 and 6'. Due to this rotation, a rotation of the magnets with respect to each other is effected at the same time, which magnets then get into a position of repulsion, so that the closure pops open on its own.

FIG. 1*b* shows the closure according to the prior art in the moment in which the spring locking pieces 9*a*, 9*a*' have contact with the locking pieces 5 and 5'. In this position, the spring locking pieces 9*a*, 9*a*' are not yet pushed aside by a predetermined amount in the radial direction Y and the magnets face each other at a distance X. It is apparent for the skilled person that the angle of the bevel at the locking piece and at the spring locking piece is only variable to a limited extent when the function should be maintained. The relations between the distance X and the magnitude of the displacement path in direction Y will be explained by means of the following Figures.

Figure 1C:
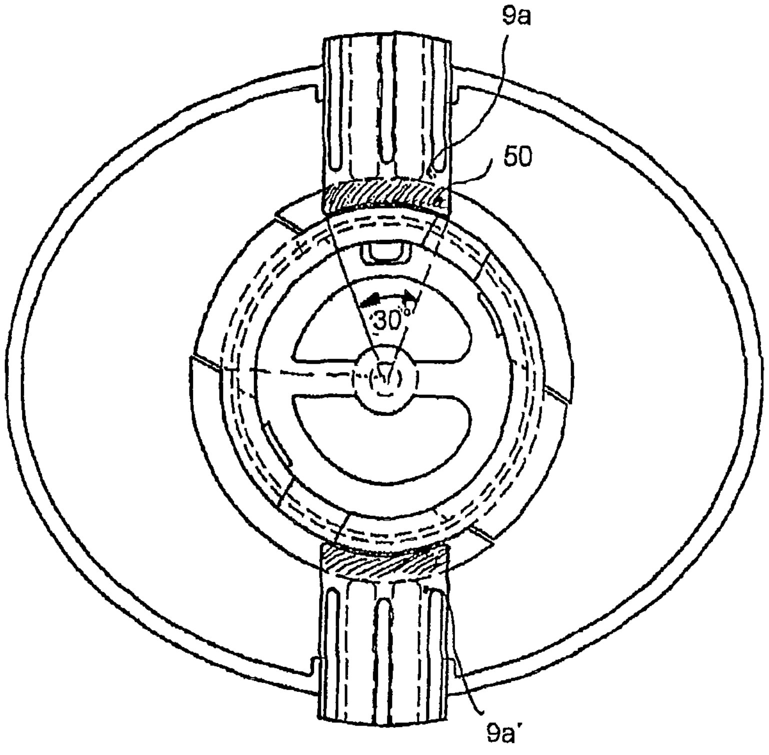
Fig. 1c (PRIOR ART)
FIG. 1*c* shows a top view of the closure according to FIG. 1*a;*

FIG. 1*c* shows a top view of the spring locking pieces 9*a*, 9*a*', which have snapped into place behind the locking pieces 5 and 5'. Here, the hatched undercut surfaces 50, 51 can be seen. It is quite obvious that in this prior art the width of the spring locking pieces 9*a*, 9*a*' cannot be broadened when it should be ensured that the closure should at least partly be poled for repulsion with a rotation between 100 and 130°. Thus, the undercut surface cannot be increased either.

FIGS. 2*a*-*d* show a closure of the invention according to claim 1. In module A (51) the magnets 4*a, b* are located, which can be rotated with respect to the magnets 8*a, b* in module B (52) from a closed position with maximum magnetic attraction into an open position with magnetic repulsion.

Figure 2A:
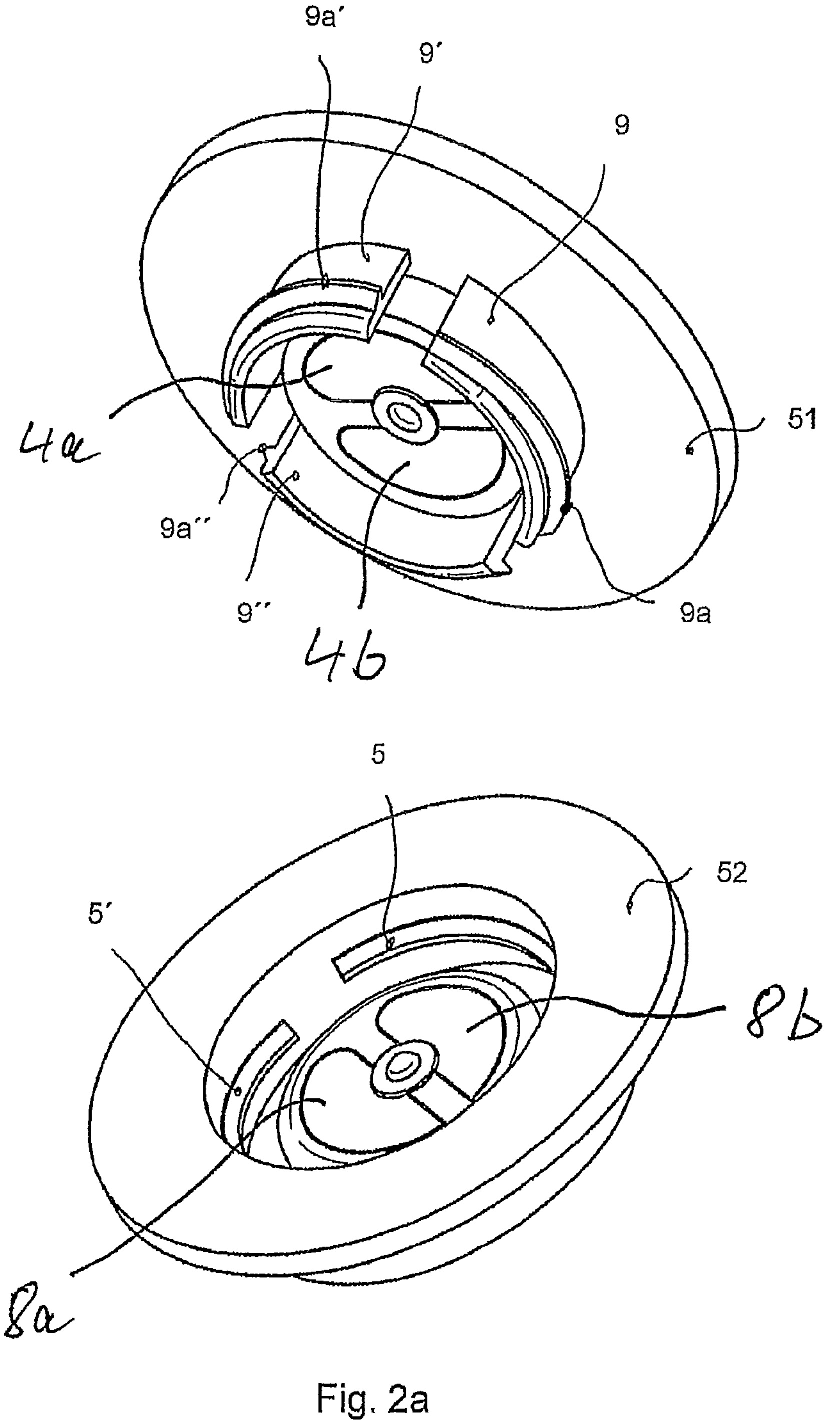
FIG. 2*a* shows a perspective view of a closure according to the invention.
Figure 2B:
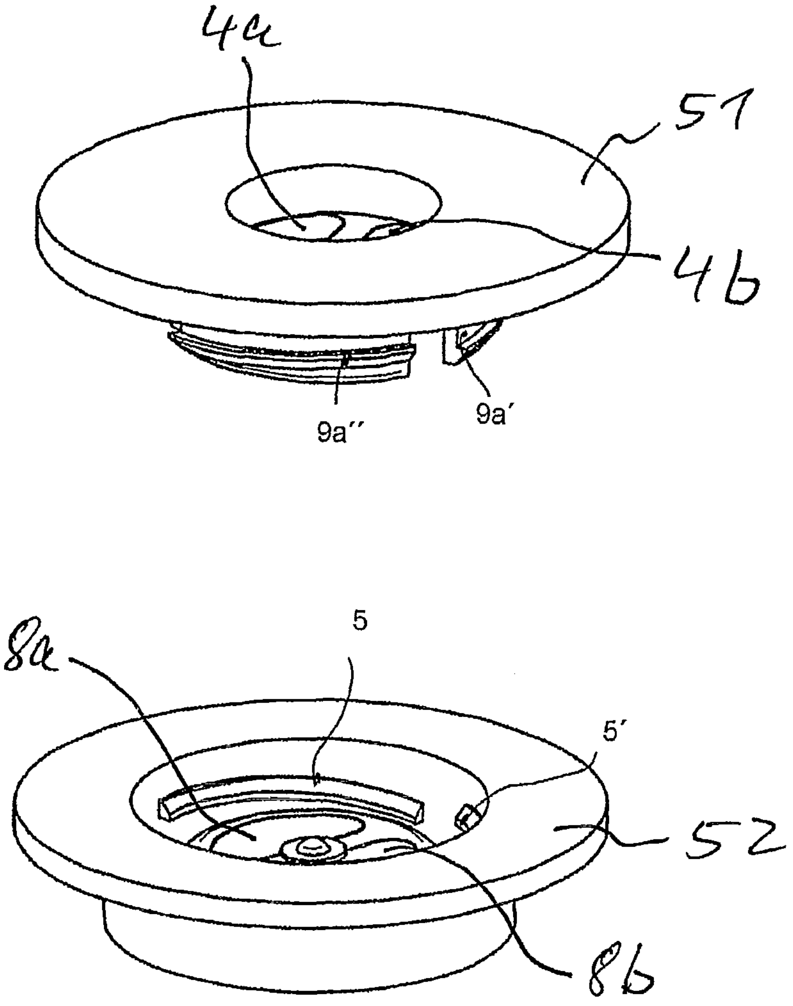
FIG. 2*b* shows another perspective view of the closure according to FIG. 2*a;*
Figure 2C:
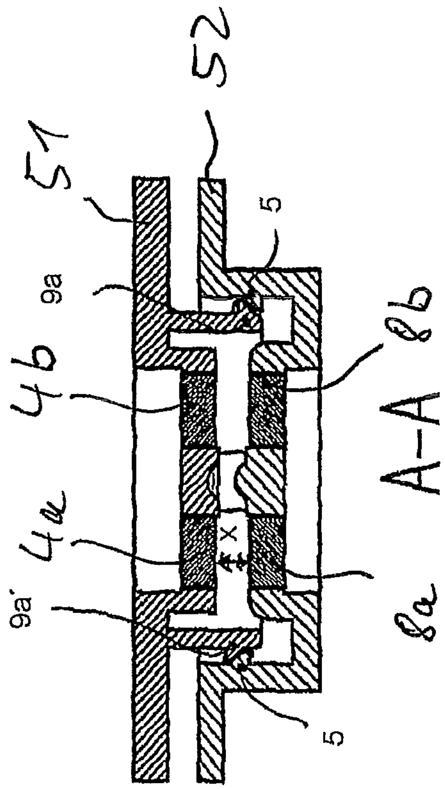
FIG. 2*c* shows a sectional drawing of the closure according to FIG. 2*a;*

In the perspective views of FIGS. 2*a, b* the helically ascending locking pieces are designated with 5, 5', 5" and the spring locking pieces are designated with 9*a*, 9*a*', 9*a*". The locking pieces and the spring locking elements are bevelled at the sides contacting each other on closing, so that the spring locking element is pushed aside on closing. After snapping into place, the closure can be released by turning open module A and module B.

Figure 2D:
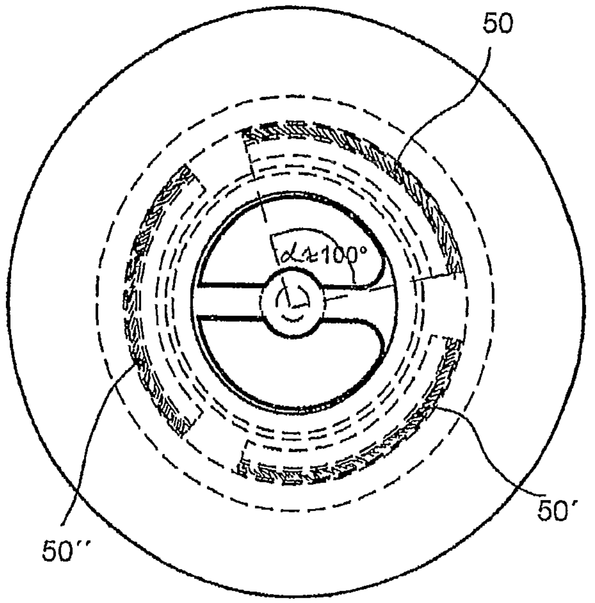
FIG. 2*d* shows a plan view of the closure according to FIG. 2*a;*
Figure 3A:
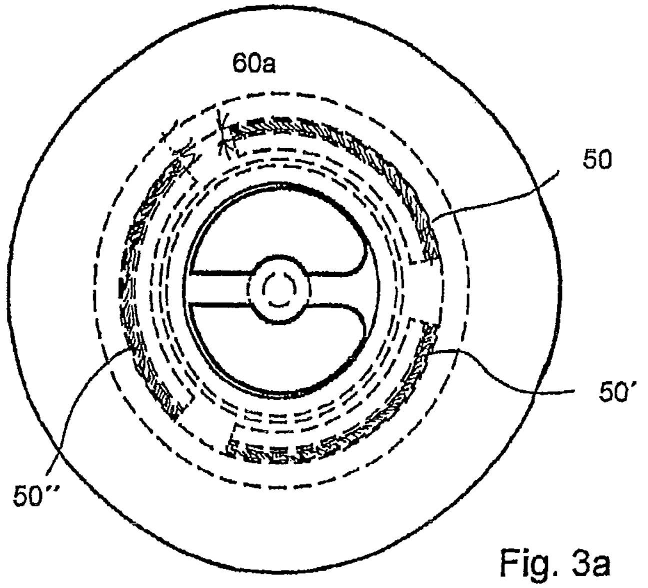
FIG. 3*a* shows a comparison of the invention with the prior art.
Figure 3B:
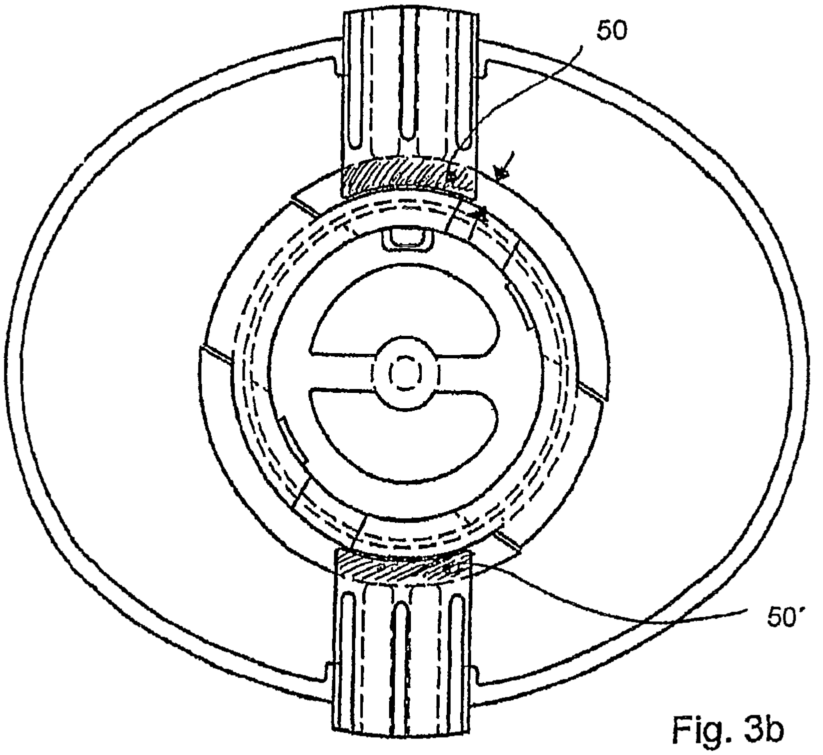
Fig. 3b (PRIOR ART)
FIG. 3*b* shows a comparison of the invention with the prior art.

In the sectional drawing 2*c*, the closure is illustrated in the moment of closing, in which the spring locking element and the locking piece have contact for the first time and the magnets 4*a, b* and 8*a, b* face each other spaced by the distance X. This will be discussed in detail in the description of FIGS. 3*a, b*. FIG. 2*d* shows a plan view of the closure with contour lines of the concealed lines. Here, the undercut surface 50, 50', 50" is hatched. It can be seen that each spring locking element can have an angular width of approximately 120° and the three spring locking elements thus cover approximately 360°, whereby the undercut surface can be designed substantially greater, which will be explained below:

With reference to FIG. 3*a*, the invention is compared with the prior art 3*b*. It can be seen that the undercut surface, which is formed of the three surfaces 50, 50' and 50", apparently already is distinctly larger than the undercut surface in FIG. 3*b*, which is formed of the surfaces 50 and 50'.

Figure 4B:
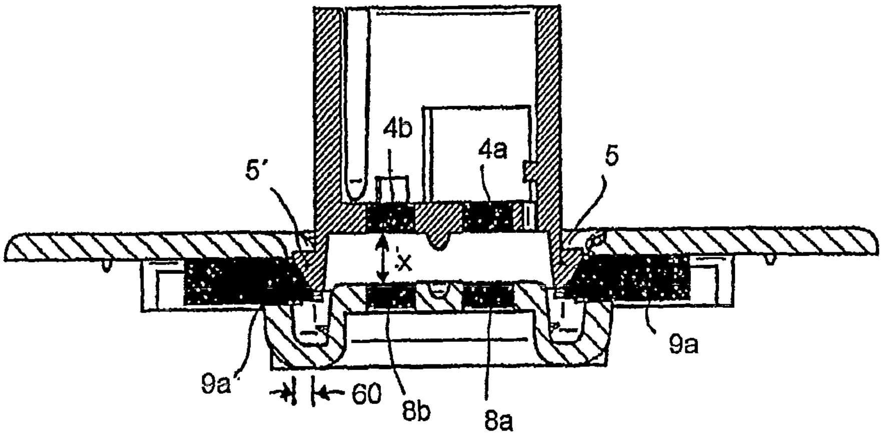
Fig. 4b (PRIOR ART)
FIG. 4*b* shows a comparison of the invention with the prior art.
Figure 4A:
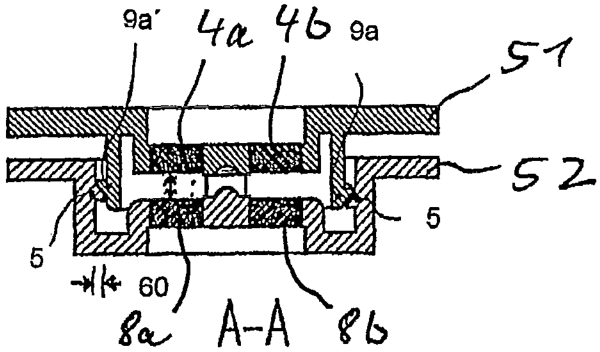
FIG. 4*a* shows a comparison of the invention with the prior art.

In FIGS. 4*a*, 4*b* the distances X of the magnets in the prior art 4*b* and in the closure 4*a* of the invention are compared. It can be seen that in the invention the distance X between the magnets 4*a, b* and 8*a, b* is substantially smaller than in the prior art according to FIG. 4*b*. The reason is the small undercut depth 60.

It is quite obvious that weaker and/or smaller magnets can be used in the closure of the invention, which leads to a high savings potential.

Figure 5A:
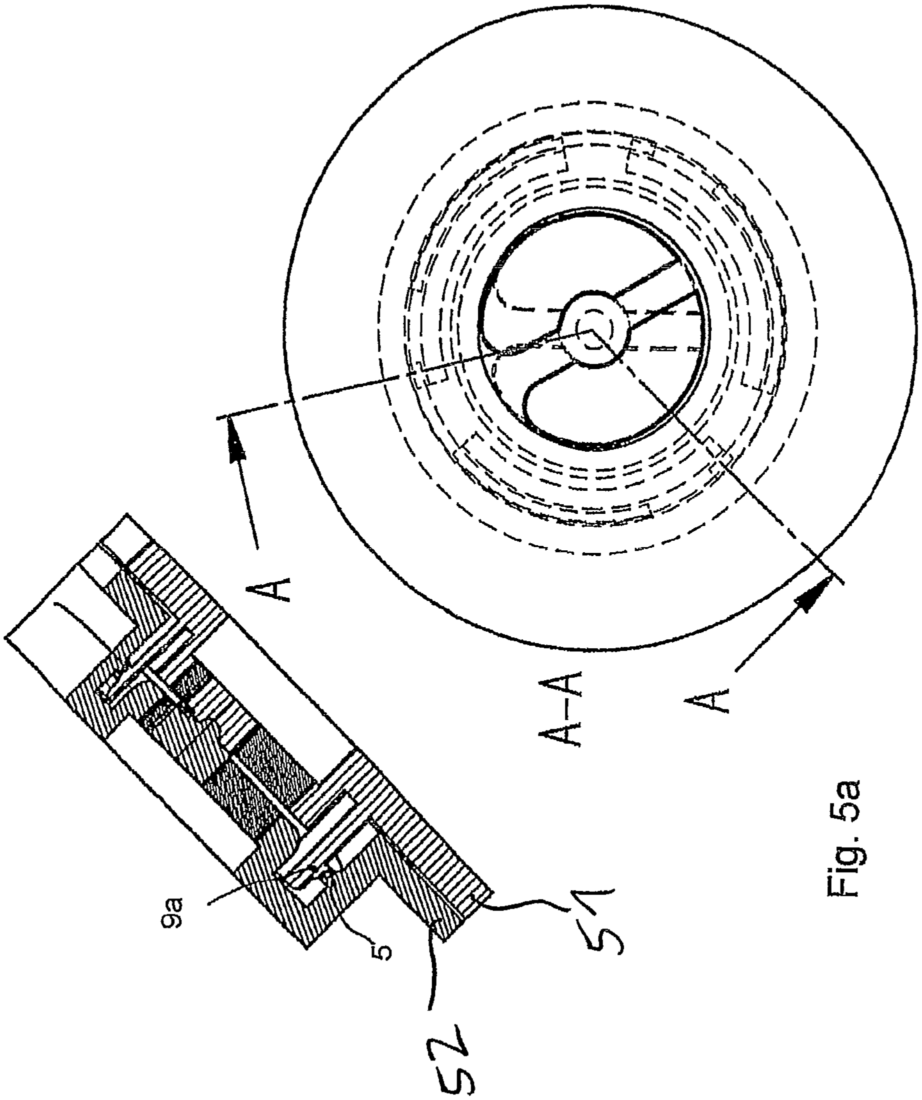
FIG. 5*a* shows the functional details of the opening process.
Figure 5B:
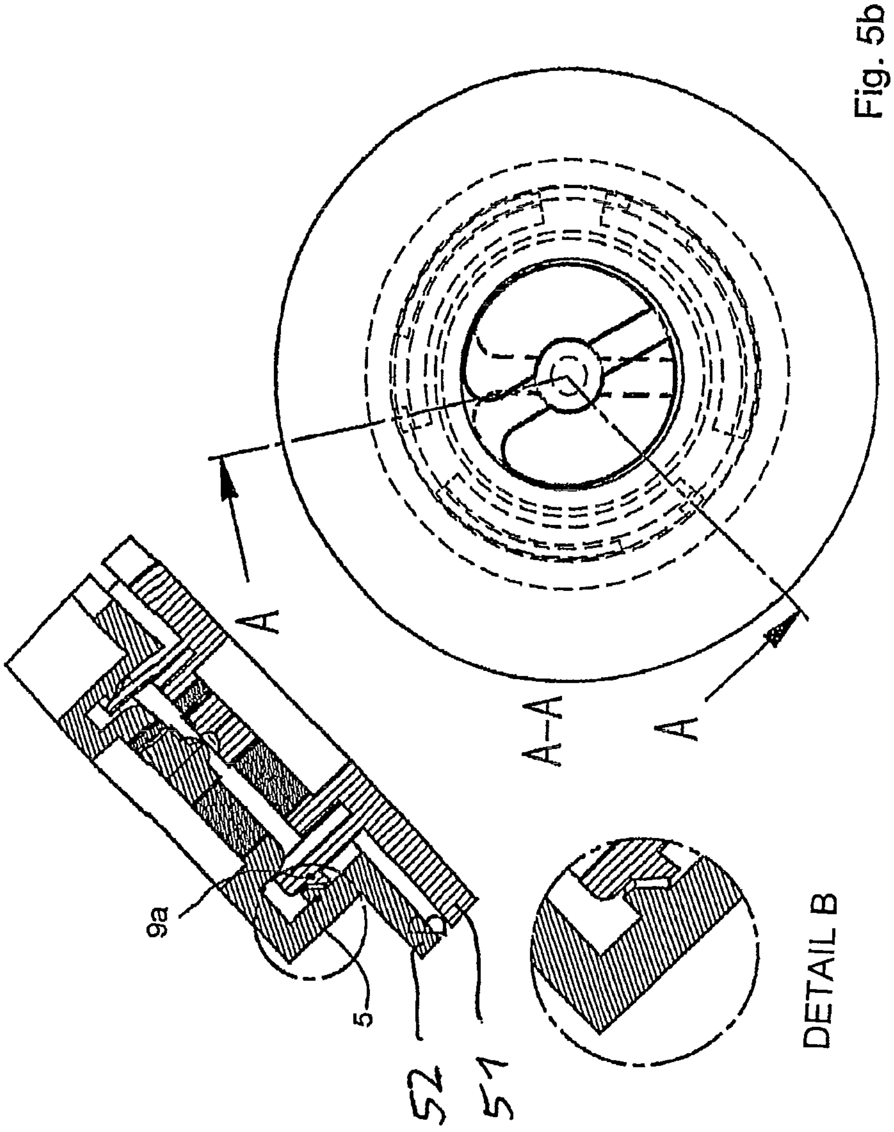
FIG. 5*b* shows the functional details of the opening process.
Figure 5C:
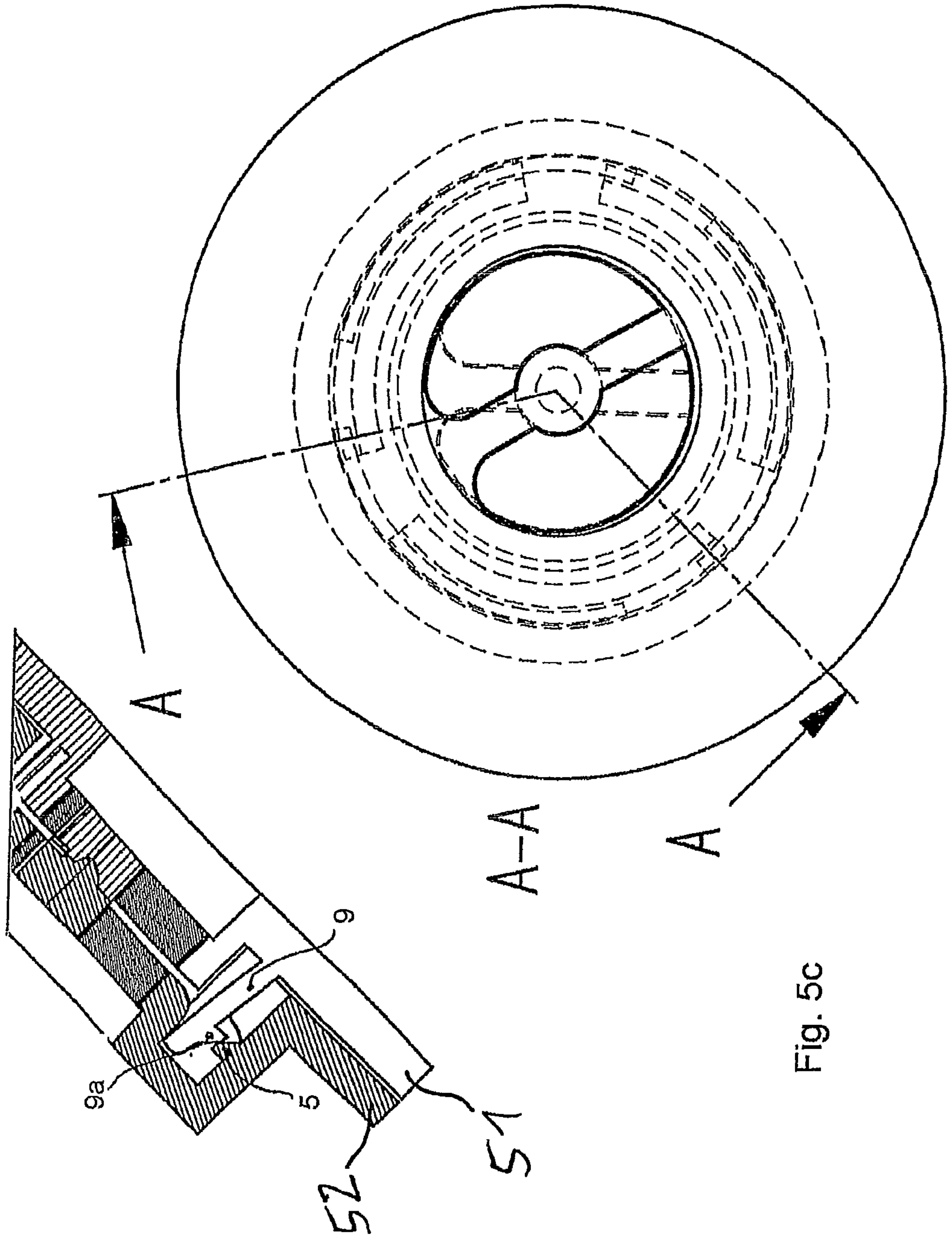
FIG. 5*c* shows the functional details of the opening process.

For further explanation, FIGS. 5*a* to 5*c* show the functional details of the opening process:

FIG. 5*a* shows the technical non-real representation, in which it can be seen that on opening the bevelled sides of locking piece and spring locking element collide. Depending on the dimensioning of the magnetic system and the spring elasticity of the spring locking element used, this collision can provide two different effects:

In FIG. 5*b* it is illustrated how with a relatively hard elasticity and/or a weak magnet upper and lower part of the closure open by following the thread.

In FIG. 5*c* it is illustrated how with relatively soft spring locking elements and/or strong magnets the spring locking elements are pushed aside on opening and the form fit is eliminated prematurely.

Frequently, a mixed form exists between FIG. 5*b* and FIG. 5*c*, in that upon start of the opening rotation the spring locking element first is slightly pushed apart and pretensioned and at a predetermined angle of rotation the bevels of the locking piece and of the spring locking element drive the upper and lower parts apart. In both cases, however, the closure must be rotated for complete opening, until the threads have completely been rotated out of engagement.

It is clear to the skilled person that various embodiments of the invention are equally inventive:

- module A is firmly connected with a first element and at the same time module B is firmly connected with a second element, and for opening the first and second elements are rotated against each other. For example, a module A firmly connected with a mobile telephone can rotatingly be removed from a holder by rotating the telephone, with module B being firmly connected with the holder. (Embodiment according to FIGS. 2*a*-*d*)
- Module A is rotatably arranged in a second element and module B is firmly connected with a second element. In the configuration as closure for a bag, for example, module A can be rotatably arranged in the bag lid via a turning handle, and module B can be firmly connected with the lower part of the bag. (Embodiment according to FIG. 6*c*, wherein reference numeral 103 designates the first element, 106 the module A, 104 the second element and 105 the module B).
- Module A and module B also can both be rotatably arranged in each of a first and a second module. Then, module A and module B are rotated against each other via one operating handle each. This is convenient in particular when in an object accessible from all sides the location of the operating handles should not be fixed in advance.

When dimensioning the invention, it should be noted that the closure has the tendency to unscrew under load. Therefore, magnetic systems must be used which effect a moment of reverse rotation into the closed position with maximum attraction, such as a rectangular magnet and a rectangular armature or a second magnet. Furthermore, the thread geometry and the friction between the locking piece and the spring locking element must be taken into account.

An advantageous development utilizes exactly this tendency that the screw tends to unscrew on its own under load for an automatic emergency release from a certain load. Here, the helical engagement portions have such a great thread pitch that the closure rotatingly opens automatically when a certain load is exceeded.

Figure 13:
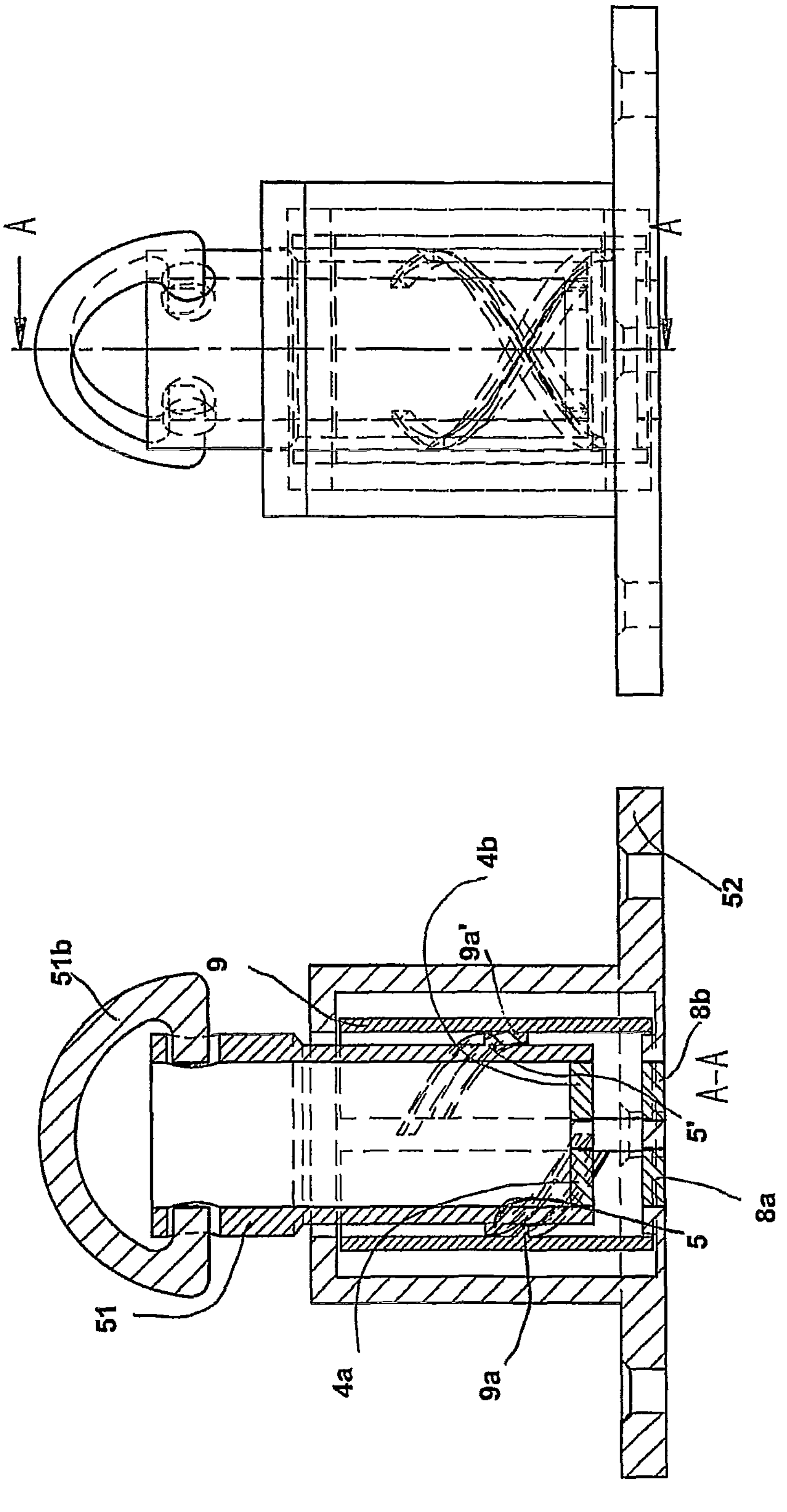
FIG. 13 shows a further embodiment of the invention.
Figure 14:
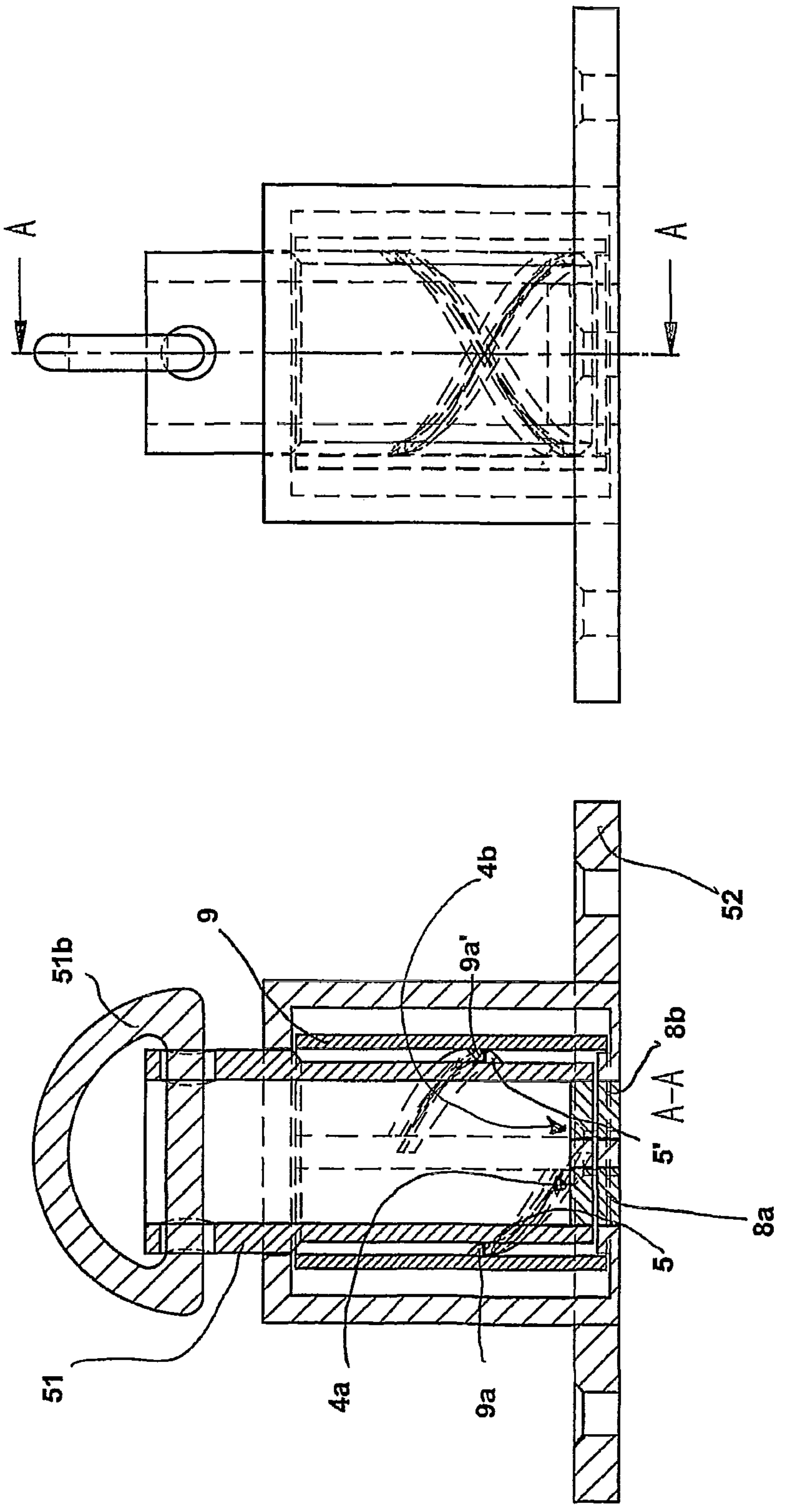
FIG. 14 shows the closure according FIG. 13 after having snapped into place.
Figure 15:
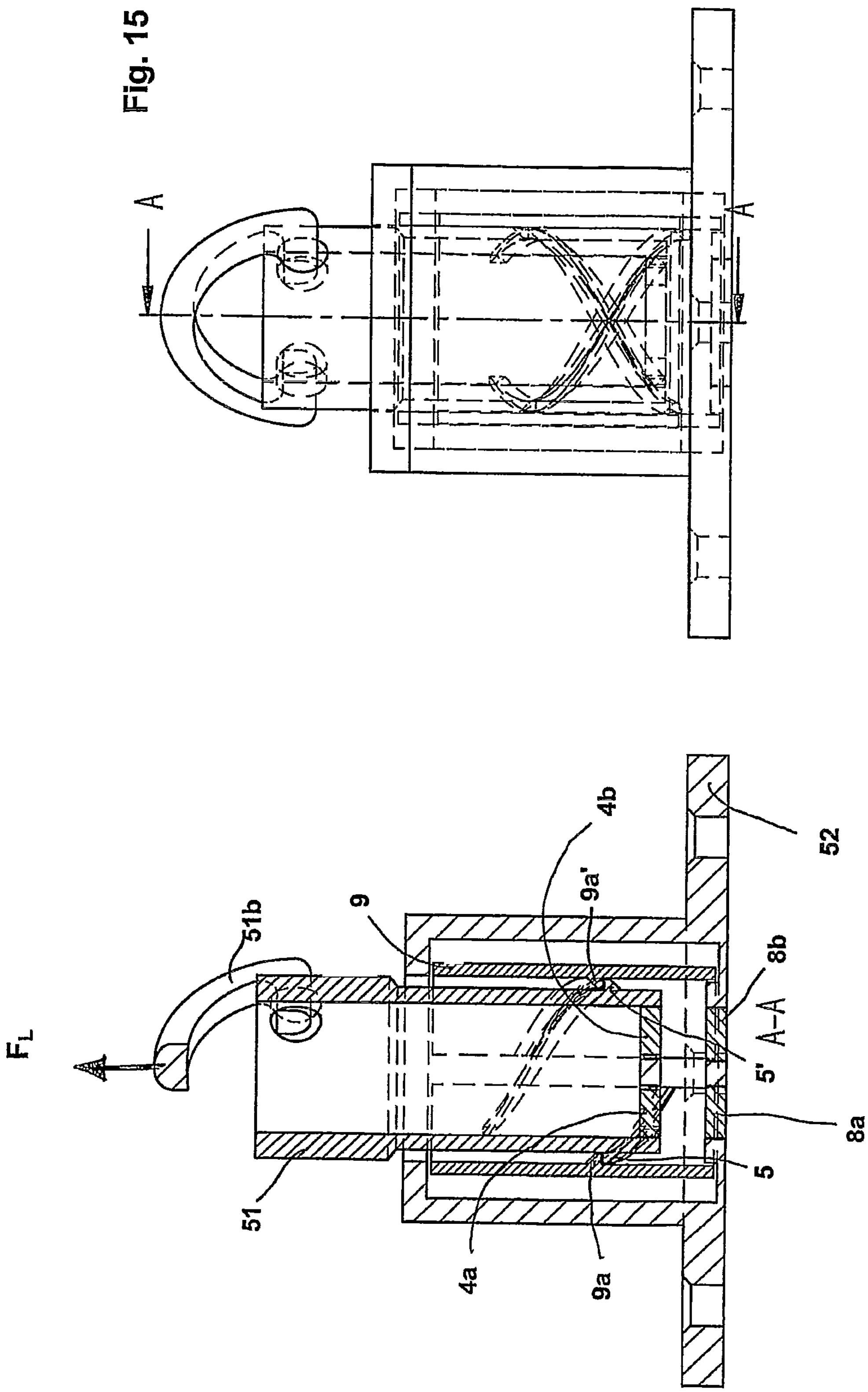
FIG. 15 shows the closure according FIG. 13.

FIGS. 13-15 show an embodiment of such a development of the invention, each in a side and sectional view in three different phases of movement. In this embodiment, the thread pitch of the helical engagement portions (5, 5', 9*a*, 9*a*') and the shape, location, polarity and strength of the magnets (4*a*, 4*b*, 8*a*, 8*b*) in module A (51) and module B (52) is chosen such that the closure opens when a predetermined load $F_L$ is exceeded.

FIGS. 13-15 show a closure consisting of a connector 51 with eyelet 51*b*, to which for example a rope is attached. An application of the invention is an emergency release between a steering kite ("Kite") and a trapeze which is securely strapped to a person surfing on a surfboard. Here, an emergency release is prescribed from a predetermined tensile load of about 80 kg, to prevent the kite from drawing the person under water in a fall and prevent the person from drowning.

FIG. 13 shows the closing phase in which the helical engagement portions 5, 5' and 9*a*, 9*a*' on connector 51 and spring washer 9 snap into engagement by means of the magnetic force of the opposed magnets 4*a*, 4*b* and 8*a*, 8*b*.

FIG. 14 shows the closure after having snapped into place.

FIG. 15 shows how the connector 51 has been turned out of the housing 52 a bit by the acting load $F_L$.

The spring washer must non-rotatably be held by a suitable constructive measure, e.g. a protrusion on the housing 52, which engages in the opening slot in the spring washer 9. The emergency release function will be explained in detail below by means of FIGS. 16 and 17.

Figure 16:
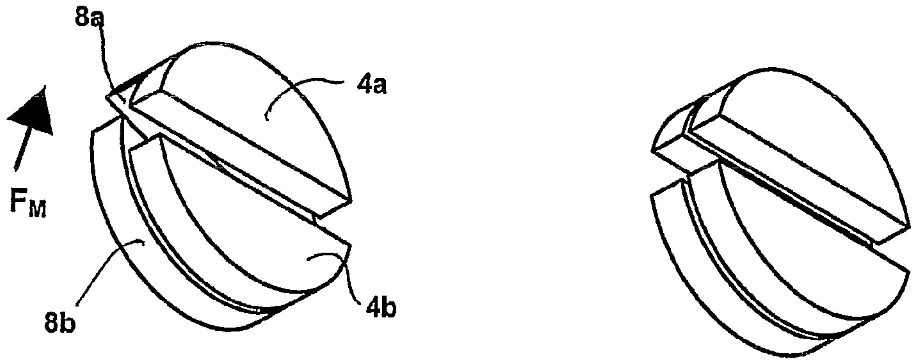
FIG. 16 shows the emergency release function.

In the closure of the invention, magnets or magnet and armature are arranged in module A and module B such that the same are weakened in their mutual attraction or poled oppositely, when module A is rotated relative to module B. For rotating, a force dependent on the shape, location, polarity and magnetic force of the magnets is required. This force can change with increasing rotation depending on the shape, location, polarity of the magnets. To simplify the discussion it is assumed that at the beginning of the rotation an approximately constant starting torque $F_M$ must be overcome. In FIG. 16, the starting torque is shown in a magnetic system of four magnets 4*a*, 4*b* and 8*a*, 8*b*, which are rotated from a position of mutual attraction into a position of at least partial repulsion.

What is decisive for the mode of action of the emergency release chiefly is this starting torque, since after a partly performed screwing opening the magnets are also separated a bit and quickly lose force both in their attractive effect and in their reversely rotating effect.

Figure 17:
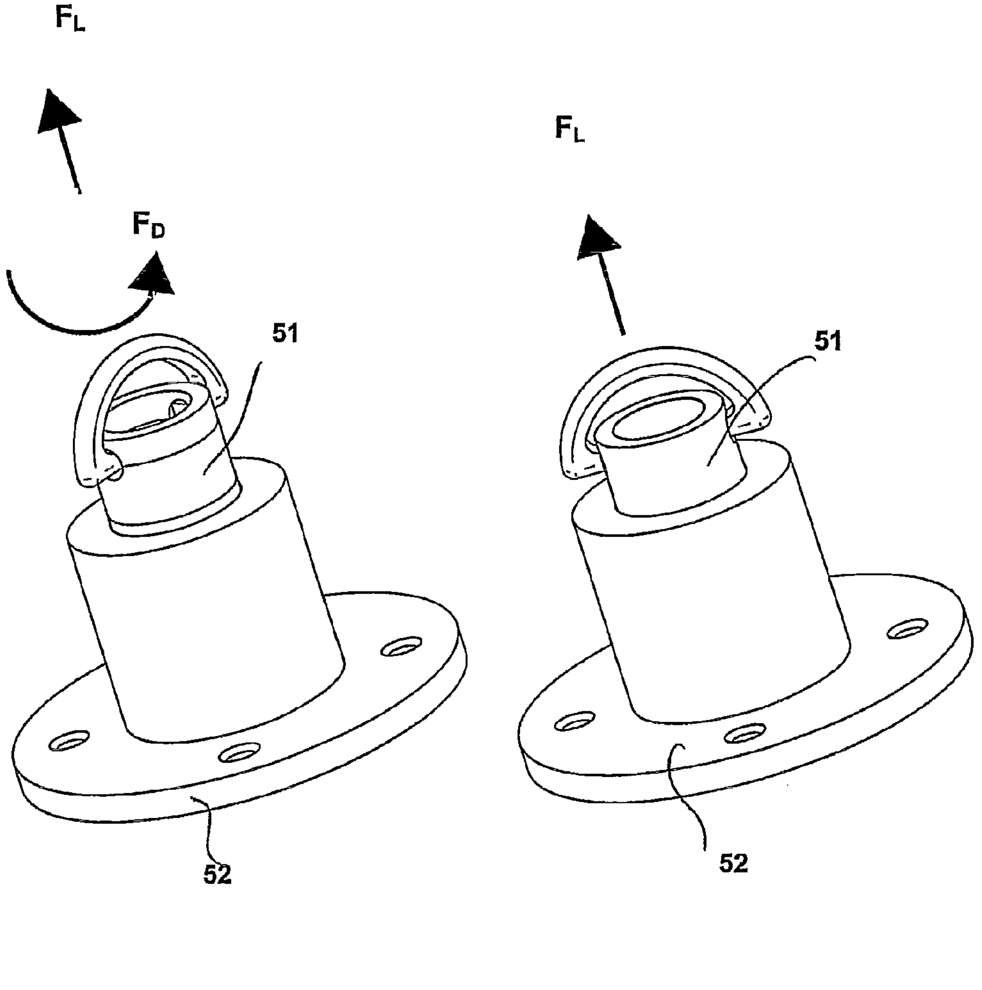
FIG. 17 shows the emergency release function.

FIG. 17 shows the embodiment in the rest position (right) and in the partly screwingly opened position (left). If no magnets were arranged in the connector 51 and housing 52, a loading force $F_L$ would screwingly turn out the connector, provided that a friction between connector and spring washer in the threads is neglected. The load $F_L$ effects a torque $F_D$. The steeper the thread the greater this torque, i.e. the easier the connector is screwingly turned out of the housing under load.

To ensure opening when a predetermined load $F_L$ is exceeded, or to ensure locking until the load $F_L$ is reached, the magnetic starting torque $F_M$ must be chosen equal to the resulting torque $F_D$ when the load $F_L$ is exceeded, i.e. the thread pitch as well as the shape, location, polarity and strength of the magnets must be chosen correspondingly in accordance with the application.

Figure 6A:
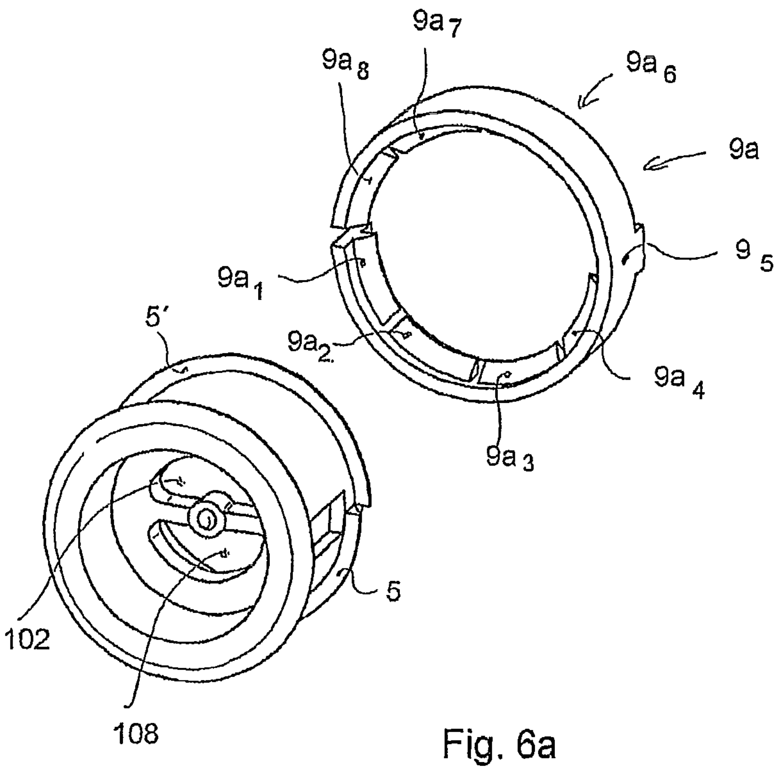
FIG. 6*a* shows a further embodiment of the invention.

FIG. 6*a* shows a locking device in a perspective view, wherein only the rotating element and the spring locking element are shown.

Figure 6B:
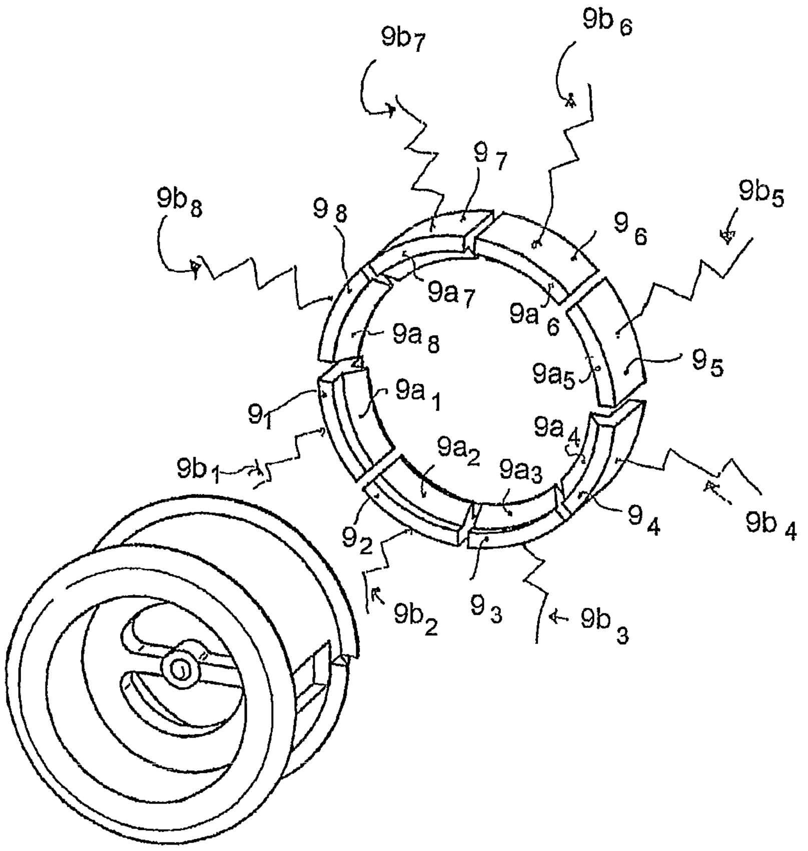
FIG. 6*b* shows the locking device according to FIG. 6*a;*

The ring-shaped spring locking element 9 here is developed such that the helical spring locking piece 9*a* is split into several segments $\mathbf{9}a_1 \ldots \mathbf{9}a_8$ by means of interruptions. The advantages of this development consist in the combination of the high undercut surface with a very soft spring constant of the spring locking element, which provides for a very easy snapping into place, with the lock, however, remaining stable. The soft spring constant of the spring locking element 9 designed as ring is formed by the interruptions between the segments $\mathbf{9}a_1 \ldots \mathbf{9}a_8$, as there a slight deformation is each possible in the desired direction. It is clear to the skilled person that there is a multitude of equivalent solutions for resilient helical engagement portions, e.g. in each segment $\mathbf{9}_1 \ldots \mathbf{9}_8$ a separate spring $\mathbf{9}b_1 \ldots \mathbf{9}b_8$ and a separate helical spring locking piece $\mathbf{9}a_1 \ldots \mathbf{9}a_8$ is arranged and the individual elements are not connected with each other, as shown in FIG. 6*b*, but together form a helical resilient engagement portion.

Lining up resilient pins in the form of a helical line functionally has the same effect.

Figure 6C:
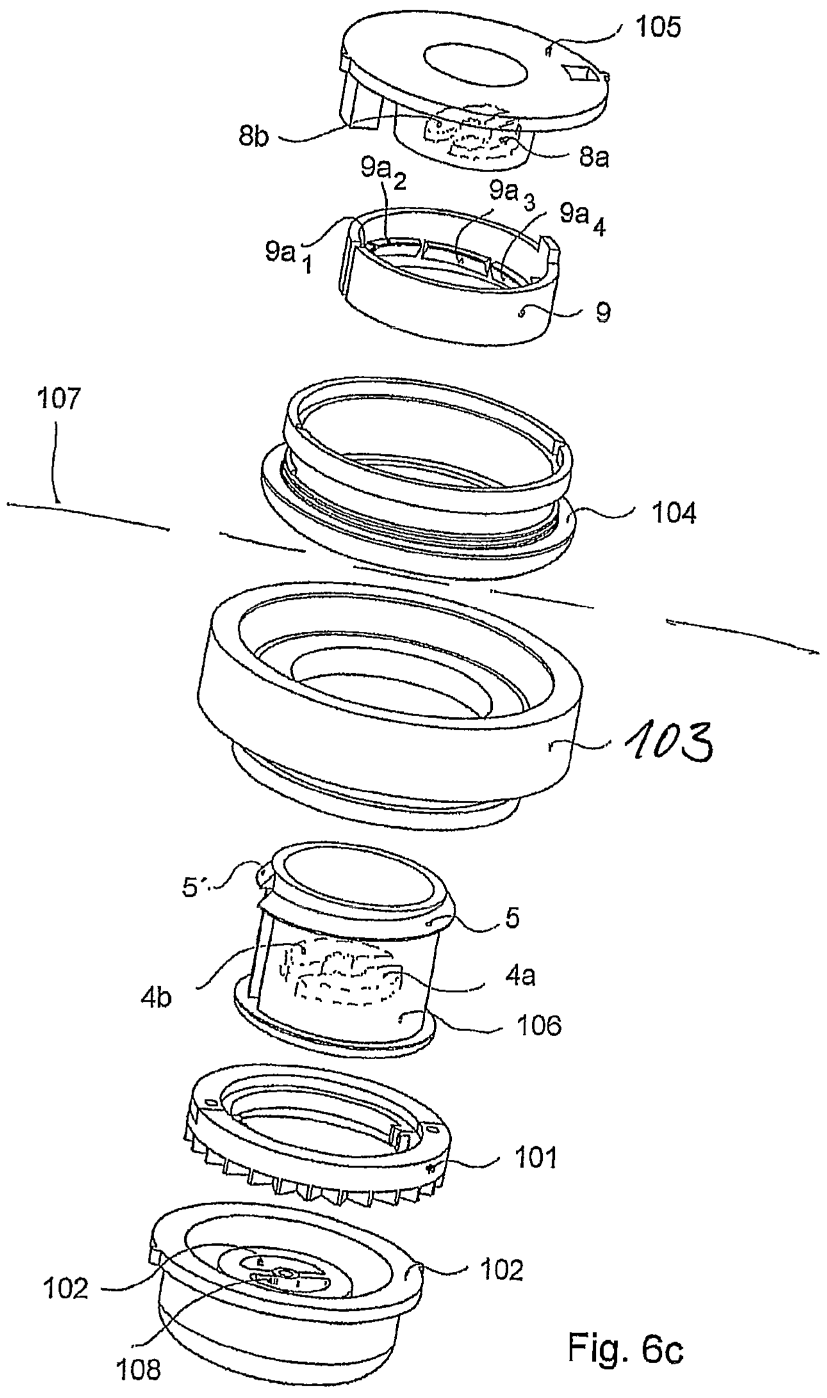
FIG. 6*c* shows a special application of the invention.

FIG. 6*c* shows a magnetomechanical connecting device in which depending on the rotation the coupling element 106 either gets into attraction to the lower part 102 or into attraction to the upper part 105, wherein it is rotated by means of a winch 101. The separating line 107 separates the parts of the upper assembly from those of the lower assembly. This application of the invention can be used e.g. as coupling device between a roller case and a bag standing on the same, wherein it is important that when placing the bag onto the roller case the coupling elements securely find each other due to the magnetic force of attraction and snap into place and after removing the bag the coupling elements are withdrawn, so that they are not damaged when the bag is put on the ground.

The particularly stable connection of the two assemblies in accordance with the invention is achieved by the form fit of the above-described spring locking element 9 with the segment-like divided, helical spring locking pieces $\mathbf{9}a_1 \ldots \mathbf{9}a_8$ and the rotating part 106 with the helically ascending locking pieces 5, 5'.

Figure 7:
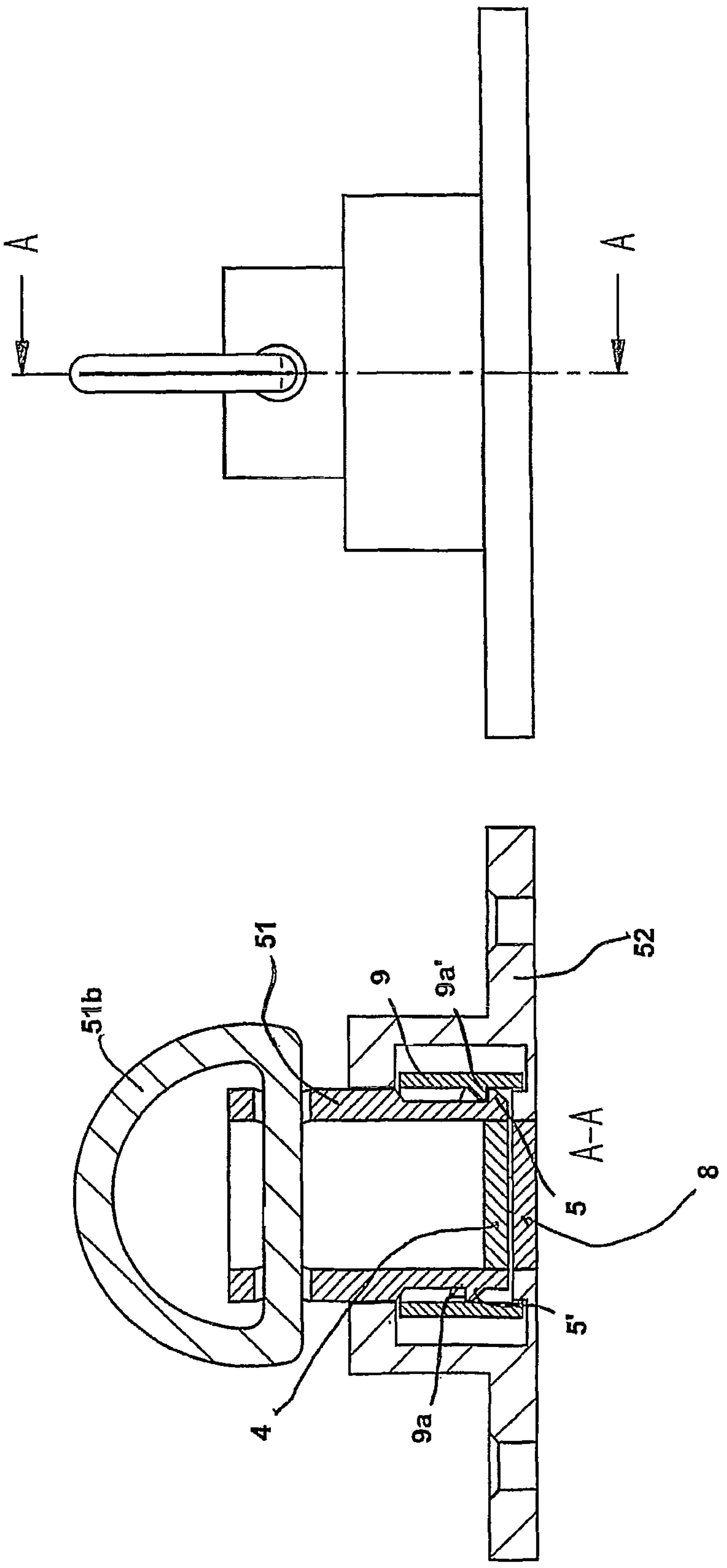
FIG. 7 shows a further embodiment of the invention.
Figure 8:
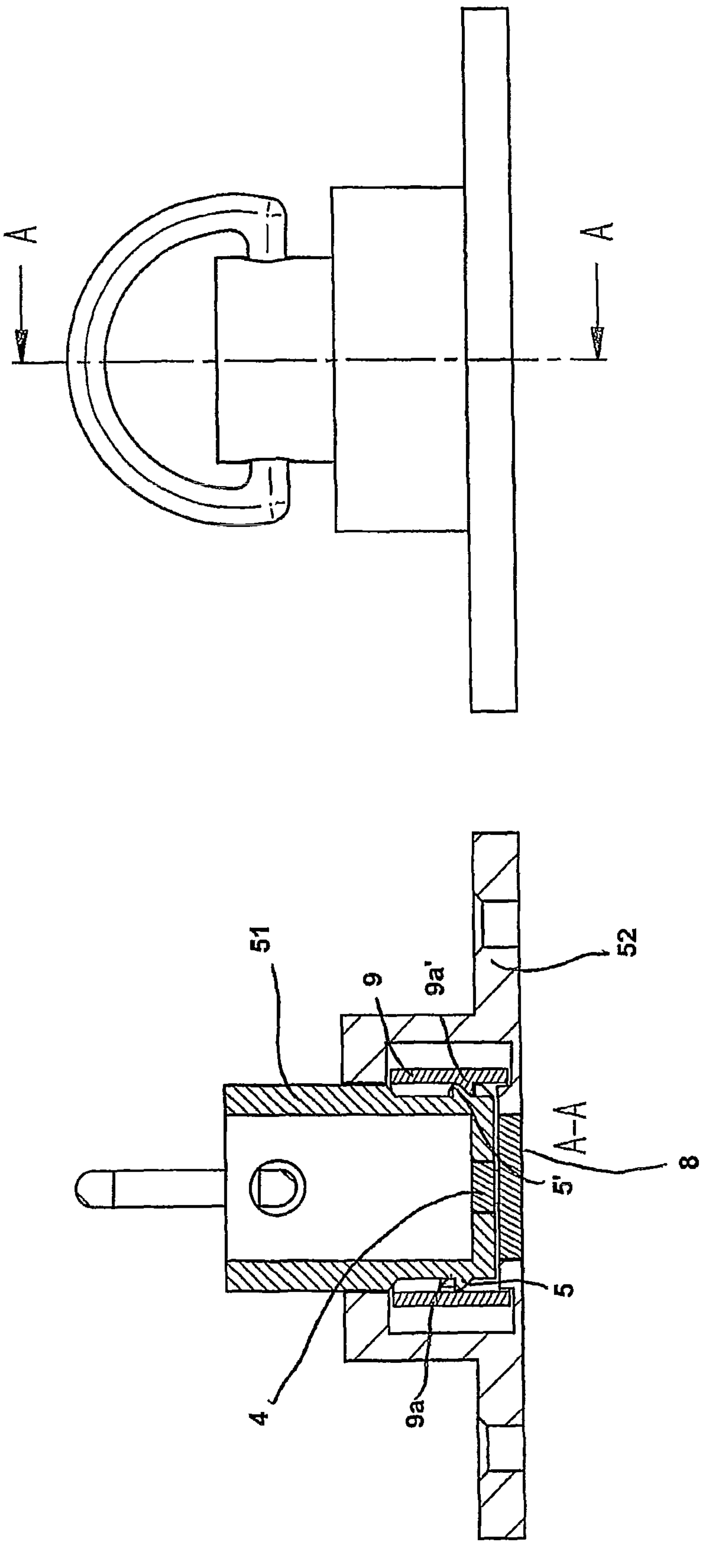
FIG. 8 shows the embodiment according to FIG. 7.

FIG. 7 and FIG. 8 show an embodiment of the invention. As magnetic system, two rectangular magnets are chosen. The spring locking element is configured as a spring washer 9 with the helical engagement portions 9*a* and 9*a'*. The spring washer is retained in the housing 52. The connector 51 with mounting eyelet 51*b* can be plugged into the housing and is rotatable in the housing. In the connector and the housing two rectangular magnets 4 and 8 are arranged. In the closed condition as shown in FIG. 7 the rectangles completely overlap each other, and there is a maximum attraction. After an actuation, a rotation by 90°, as shown in FIG. 8, the rectangles only partly overlap each other. The magnetic attraction hence has been weakened and this has required a force which has overcome the magnetic moment of reverse rotation $F_D$. In the actuated condition according to FIG. 8, the thread has been turned out of engagement by a rotation by 90°. It is clear to the skilled person that the magnetic system and the number and angular width of the threads must be adjusted to each other. In the present example, 4 threads of 90° angular width each would be possible in terms of construction for a maximum locking effect. However, only two threads of 90° each are illustrated. The undercut surface then is correspondingly smaller here. The spring washer must non-rotatably be held by a suitable constructive measure, e.g. a protrusion on the housing 52, which engages in the opening slot in the spring washer 9.

FIGS. 9-12 show a further embodiment.

Figure 12:
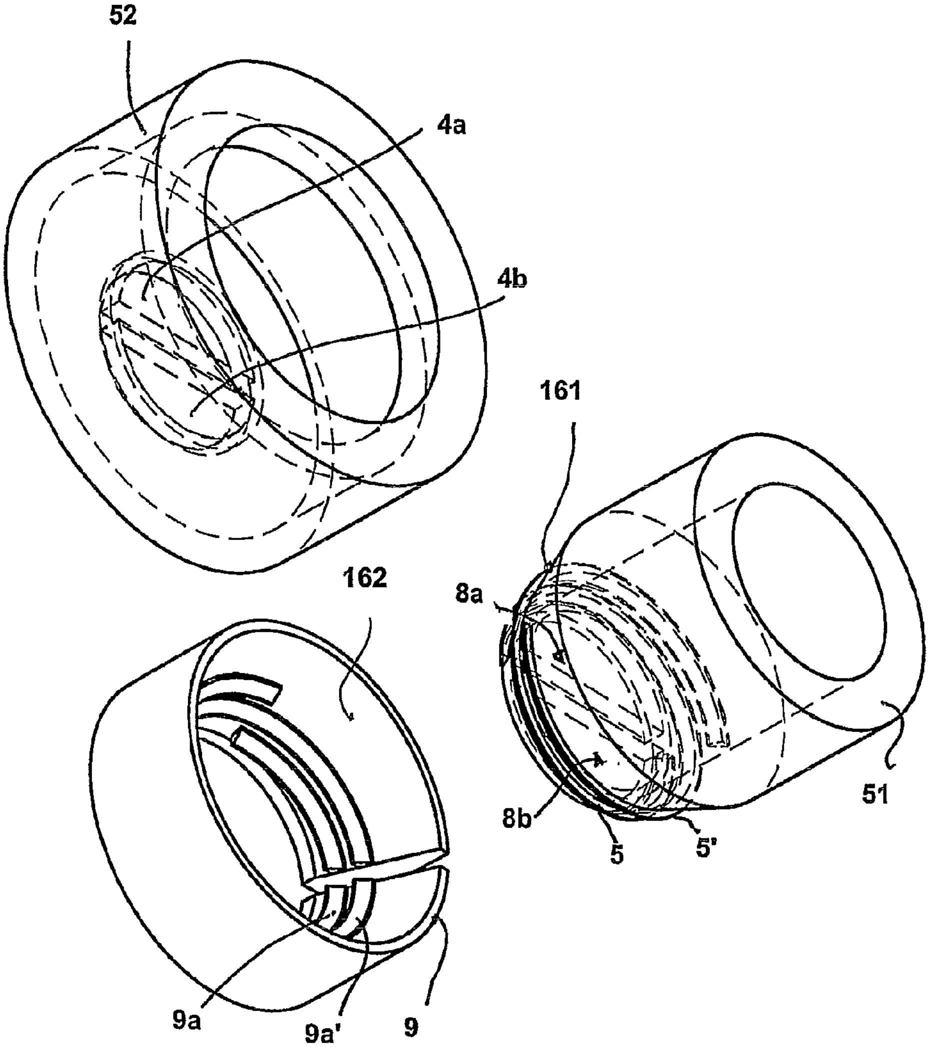
FIG. 12 shows a perspective exploded view of the most important individual parts separately according FIG. 9.

FIG. 12 shows a perspective exploded view of the most important individual parts separately. In the housing 52 two magnets 4*a* and 4*b* are arranged. In the connector 51 two magnets 8*a* and 8*b* are arranged. In the housing, the spring locking element 9 is mounted. At the spring locking element and at the connector, helical engagement portions 9*a*, 9*a'* and 5, 5' are arranged on the conical surfaces 161, 162.

Figure 9:
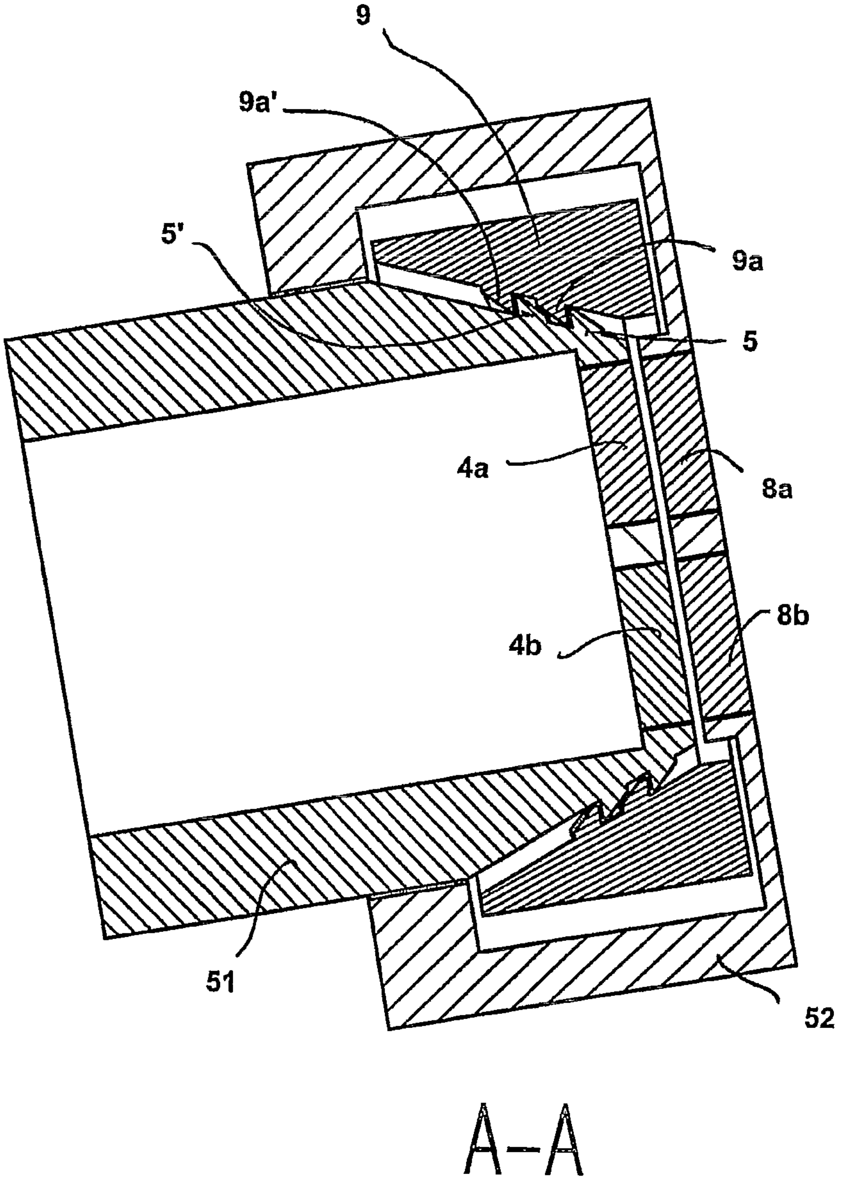
FIG. 9 shows a further embodiment of the invention.

FIG. 9 shows a sectional view of the closure in the closed condition, in which the helical engagement portions 9*a*, 9*a'* and 5, 5' have snapped into each other and provide a maximum undercut surface and hence a maximum loadability of the closure.

Figure 10:
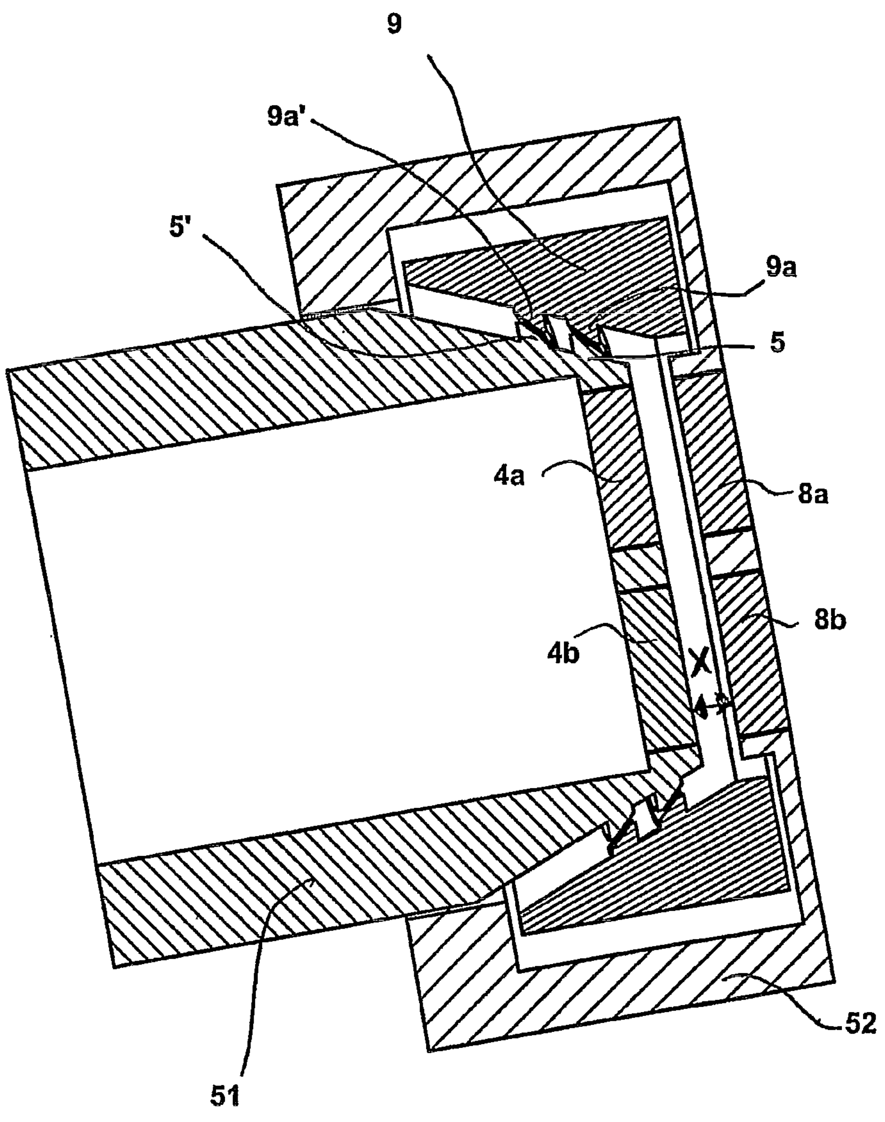
FIG. 10 shows a sectional view of the closure shown in FIG. 9.

FIG. 10 shows a sectional view of the point at which connector and housing face each other spaced by the distance X and the helical engagement portions have a first contact. At this point, the magnetic force now must be greater than the spring force of the spring locking element 9, which now is laterally pushed aside by the bevels on the engagement portions. The present embodiment provides the advantage that a plurality of engagement portions can snap into place one above the other and thus provide a great undercut surface, although the distance X is minimally small. This embodiment hence has a particularly good relation of mechanical loadability and size of the magnet and can be manufactured at particularly low cost.

Figure 11:
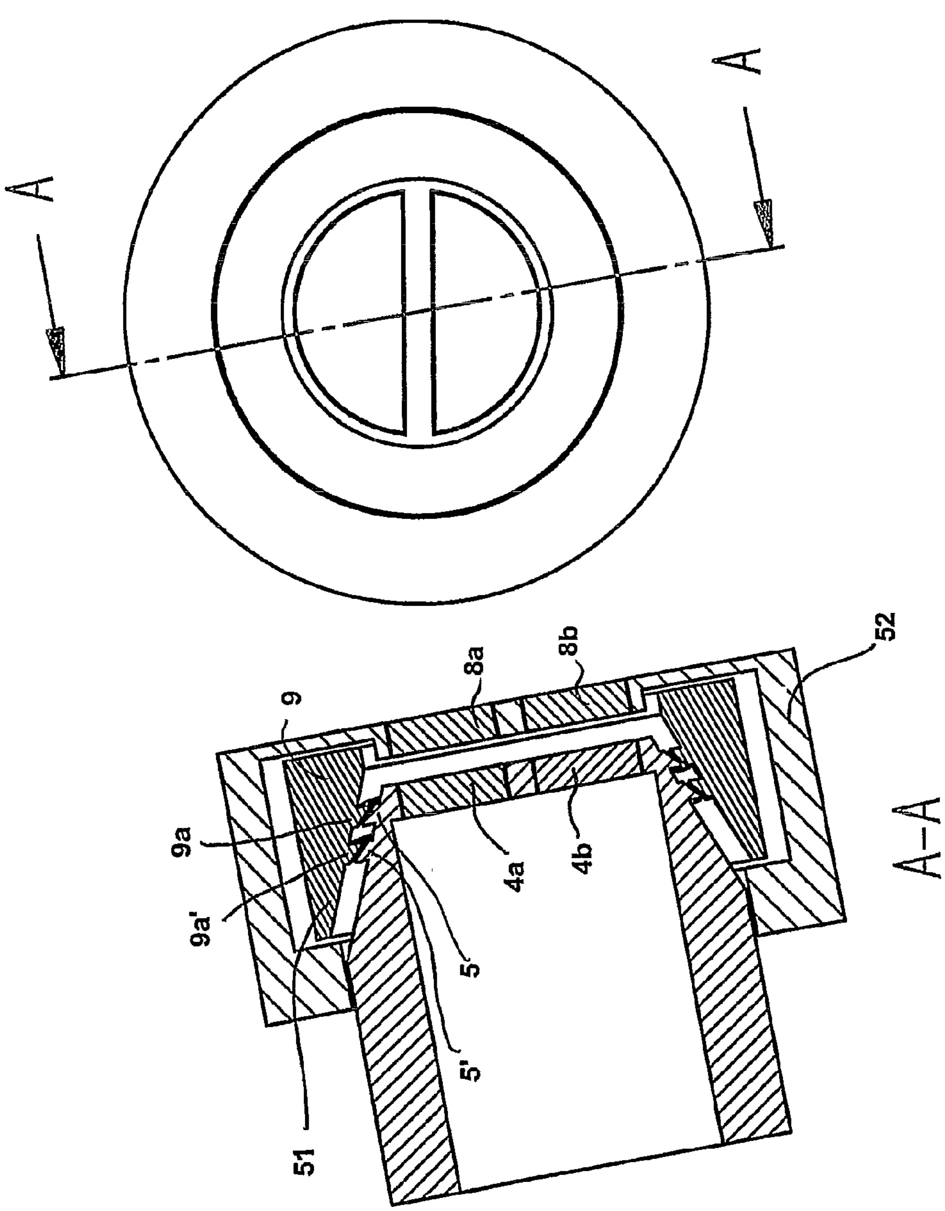
FIG. 11 shows the location of the section A-A in FIG. 9 and FIG. 10.

FIG. 11 shows the location of the section A-A in FIG. 9 and FIG. 10.

The invention claimed is:

1. A mechanical-magnetic connecting structure for releasably connecting a first element with a second element, wherein the connecting structure consists of a module A which is firmly connected with the first element or is rotatably arranged in the first element, and a module B which is firmly connected with the second element or is rotatably arranged in the second element, and wherein the module A is rotatably guided in module B, and wherein in module A at least one magnet and in module B at least one armature or second magnet is arranged and the shape, location and polarity of the magnets or of the magnet and the armature are designed such that when rotating module A relative to module B, the magnets or magnet and armature move from a closed position with maximum magnetic attraction into an open position with weakened magnetic attraction or a magnetic repulsion of module A and module B is obtained, and wherein a positive lock exists between two engagement portions on module A and module B, wherein the engagement portion, which is arranged on a spring locking element on module B, is helical, and the matching engagement portion on module A likewise is helical, wherein module A and module B close without rotation such that the helical engagement portion of module A positively snaps into place with the helical engagement portion of module B by means of the magnetic attraction, and wherein module A and module B can be opened such that when rotating the modules and hence rotating the magnets from the closed position into the open position the helical engagement portions are screwed out of engagement.

2. The mechanical-magnetic connecting structure according to claim 1, wherein the helical engagement portions of module A, module B or module A and module B have a plurality of threads.

3. The mechanical-magnetic connecting structure according to claim 1, wherein the spring locking element consists of a plurality of individual segments each with one helical engagement portion and one spring element.

4. The mechanical-magnetic connecting structure according to claim 1, wherein the helical engagement portion of the spring locking element consists of a plurality of resilient pins arranged on a helical line.

5. The mechanical-magnetic connecting structure according to claim 1, wherein the thread pitch of the helical engagement portions and the shape, location, polarity and strength of the magnets in module A and module B are chosen such that the closure opens when a predetermined load $F_L$ is exceeded.

6. The mechanical-magnetic connecting structure according to claim 1, wherein the helical engagement portion has a plurality of threads which overlappingly extend one over the other, so that a plurality of engagement portions get in engagement one over the other.

7. The mechanical-magnetic connecting structure according to claim 1, wherein the helical engagement portion has a plurality of threads which overlappingly extend one over the other, so that a plurality of engagement portions get in engagement one over the other and the engagement portions lie on conical surfaces engaging in each other.

* * * * *